United States Patent [19]
Yamashita

[11] Patent Number: 5,668,405
[45] Date of Patent: Sep. 16, 1997

[54] SEMICONDUCTOR DEVICE WITH A FILM CARRIER TAPE

[75] Inventor: Chikara Yamashita, Tokyo, Japan

[73] Assignee: NEC Corporation, Tokyo, Japan

[21] Appl. No.: 528,244

[22] Filed: Sep. 14, 1995

[30] Foreign Application Priority Data

Sep. 14, 1994 [JP] Japan ................. 6-244922

[51] Int. Cl.$^6$ ............ H01L 23/485; H01L 23/495; H01L 29/41
[52] U.S. Cl. ............ 257/668; 257/737; 257/738; 257/778
[58] Field of Search .............. 257/666, 668, 257/678, 690, 693, 697, 737, 738, 778, 787

[56] References Cited

U.S. PATENT DOCUMENTS

| | | | |
|---|---|---|---|
| 5,397,921 | 3/1995 | Karnezos | 257/698 |
| 5,468,681 | 11/1995 | Pasch | 257/737 |
| 5,519,936 | 5/1996 | Andros et al. | 257/666 |

Primary Examiner—Peter Toby Brown
Attorney, Agent, or Firm—Helfgott & Karas, P C.

[57] ABSTRACT

Disclosed is a semiconductor device which has a semiconductor IC chip, a base film forming a basis of a film carrier tape, through-holes and device holes which open in the base film, a copper-foil wiring formed on the base film, inner leads formed at the inside end of the copper-foil wiring, lands for connecting to outside, apertures formed in the center of the respective lands, cover resist formed on the base film except the lands, sealing resin for protecting the semiconductor IC chip and solder bumps.

8 Claims, 6 Drawing Sheets

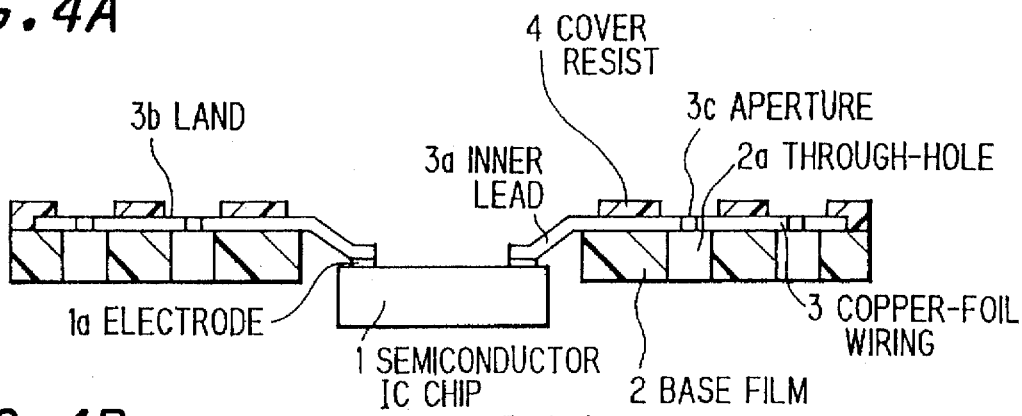
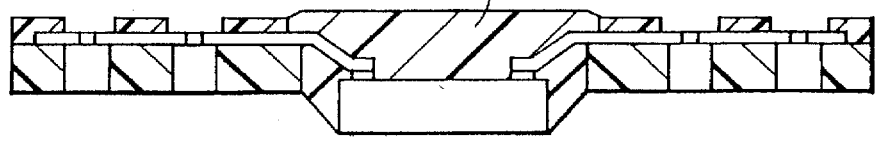
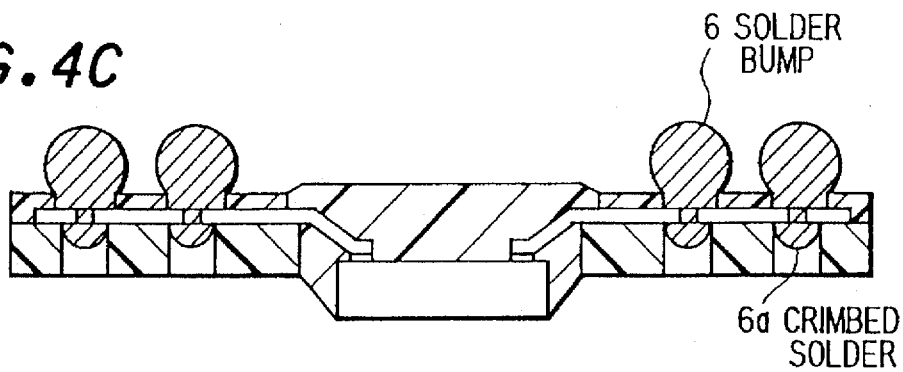
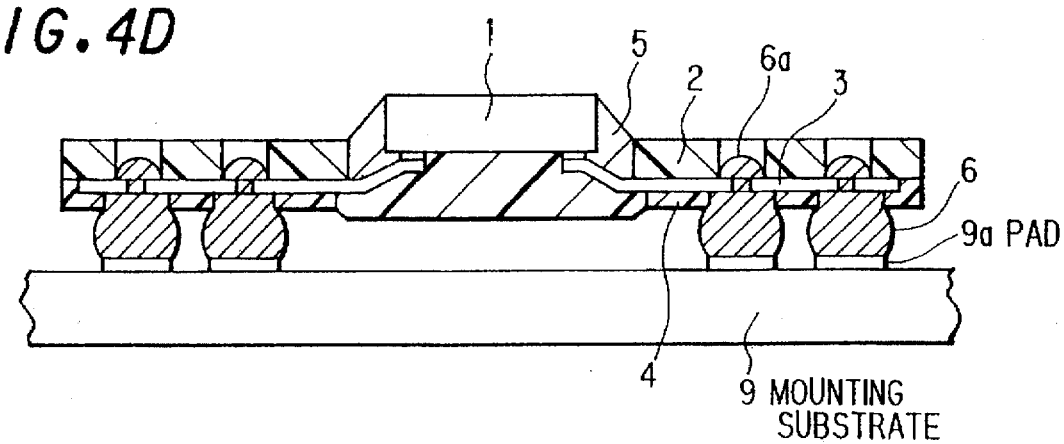

SEMICONDUCTOR DEVICE WITH A FILM CARRIER TAPE

FIELD OF THE INVENTION

This invention relates to a semiconductor device, and more particularly to, a semiconductor device in which a semiconductor integrated circuit is mounted on a film carrier tape.

BACKGROUND OF THE INVENTION

A method for making a conventional semiconductor device with a film carrier tape is as follows:

Prepared is a base film which is made of polyimide, polyester, glass-epoxy or the like and in which sprocket holes for carrying and positioning and device holes for placing semiconductor devices are opened. A metal foil of copper or the like is adhered to the base film by adhesives, thereafter etching the metal foil to form leads with given shapes and pads for electrical selection.

Next, the inner lead bonding (hereinafter referred to as "ILB") of the leads extending in the device hole of the film carrier tape to bumps formed on electrodes of an IC chip is carried out by a thermo-compression method of eutectic method. In the film carrier tape, an electrical selection test and BT (burn-in test) is then conducted. Whereafter, the leads are cut to desirable lengths to carry out outer lead bonding (hereinafter referred to as "OLB").

Herein, in the case of leads with many pins, to prevent the portions for OLB from scattering, a method of leaving insulating film composing the film carrier tape on the outer end of the outer leads is often employed. Thereafter, mounting is carried out, for example, by OLB of the leads to the bonding pads on a printed substrate.

In such method for mounting the semiconductor device with a film carrier tape, when OLB to the printed substrate is carried out, it is difficult to obtain coplanarity in leads for OLB since the lead for OLB is thin to about 35 µm. To deal with this, a bonding tool for OLB which is only used for a film carrier tape was required.

On the other hand, when it is mounted on the same substrate with another package which can be mounted by package re-flowing, for example, QFP (Quad Flat Package), the mounting thereof has to be carried out on the step separated from the re-flowing step. Because of this, a film carrier tape type semiconductor device is exactly used as a special package since it is not multipurpose.

Herein, the outer re-flow pitch in QFP which can be re-flown is limited to about 0.4 mm.

As a surface mounting type package for adapting to the limitation, "Nikkei Microdevices", pp. 58–64, March, 1994 describes BGA (Ball Grid Allay) in which solder bumps as outer terminals are disposed in the form of a lattice on the backside of the package. When a package with 220 pins and a square size of 23 to 24 mm is designed, BGA can realize a pitch of about 1.5 mm, whereas QFP needs a pitch of at least about 0.4 mm. Therefore, BGA is excellent in the mounting performance.

Further, since the outer size of BGA is small, the length of wiring in the package becomes shorter, thereby obtaining a good electrical properties. Though this BGA package uses a multilayer printed substrate, it can employ a ceramic substrate or film carrier tape.

For example, as BGA using a film carrier tape, there is a BGA package (hereinafter referred to as "first prior art") suggested by IBM corporation (EIAJ-JEDEC JWG#2-7 "TAPE BALL GRID ARRAY", May, 1994).

FIG. 1A is a cross sectional view showing the BGA package, and FIG. 1B is a enlarged cross sectional view showing a part of the BGA package which is indicated by a circle B in FIG. 1A.

In the BGA package, a copper-foil wiring 3 formed on a base film 2 is connected to a land 3b formed under the base film and a through-hole plating 3d, i.e., the film carrier tape is composed by so called a two layers-two metal technique. In the land 3b, a solder bump as an outer terminal is formed by providing a solder ball 11. A bump 1b on a semiconductor IC chip 1 is connected to the inner lead 3a of the copper-foil wiring 3. Further, a reinforcing plate 13 is pasted by an adhesive 12 thereon to reinforce the film carrier tape, and a heat spreader 15 is pasted by adhesives 10, 14 on the semiconductor IC chip 1 and reinforcing plate 13 to reduce the heat resistance.

When the BGA semiconductor device is mounted on the mounting substrate, solder paste is provided with the pads on the mounting substrate, thereafter adhering to the solder ball 11 to mount it.

However, in the BGA package with a film carrier tape, the cost making thereof increases to about five to ten times as compared with a film carrier tape made by a conventional three layers-one metal technique, since the film carrier tape thereof is made by the two layers-two metal technique.

On the other hand, the film carrier tape made by the two layers-two metal technique is subject to lack of mechanical strength caused by the tape thickness of about 50 to 70 µm, thereby causing an undulation or bend of the substrate to reduce the easiness of mounting which is a excellent property of BGA. Therefore, it needs the reinforcing plate 13 for reinforcing the mechanical strength. However, there is a problem that the solder ball 11 as a connecting means to the substrate can not be checked with the naked eye after mounting. Though the mounting state can be optionally checked by the other way, for example, a x-ray instrument, it is not a proper way for the mass production and it will result in a package with high cost. In brief, the first prior art lacks in the easiness of mounting and it is not multipurpose to various use.

Next, Japanese Patent Applications Laid-Open No. 61-51945 and 1-258454 disclose another type of semiconductor device in which the state of soldering after mounting can be checked on a package substrate. FIGS. 2A and 2B shows the semiconductor device disclosed in Japanese Patent Applications Laid-Open No. 1-258454 (hereinafter referred to as "second prior art").

The semiconductor device is called LGA (Land Grid Array). It uses a rigid substrate as a package substrate 16 which is similar to that of the above-mentioned standard BGA package, forming a copper-foil wiring on and under the substrate 16, connecting between lands 17a and 17b which are formed in a grid form on and under the substrate by through-hole plating 17c, further compressing and bonding a copper plate to the center of the backside of the substrate. Solder plating 19 is provided with the land 17b.

A semiconductor IC chip 1 is adhered by an adhesive 10 to the concave portion formed in the center of the substrate. The semiconductor IC chip 1 and the copper-foil wiring 17 are connected by a bonding wire 20, thereafter being sealed with sealing resin 5.

When the LGA package is mounted on a mounting substrate 9, as shown in FIG. 2B, solder paste is previously coated to the pads on eh mounting substrate 9 by a screen printing method or the like, positioning and mounting the LGA package to the mounting substrate 9 and re-flowing the solder.

In the mounting, i.e., re-flowing, process, solder 21 on the mounting substrate 9 climbs up passing the through-hole to form climbed solder 21a. The solder junction between the mounting substrate 9 and the package substrate 16 can be checked through the climbed solder 21.

On the other hand, Japanese Patent Application Laid-Open No. 63-34936 discloses a LGA package with a film carrier tape (hereinafter referred to as "third prior art"). This package is made by forming a copper-foil wiring on the film carrier tape, forming a land on the backside of the tape, connecting them by a through-hole and carrying out ILB of a semiconductor IC chip to the inner leads of the copper-foil wiring. Similarly to the second prior art, this package is mounted after solder paste is previously coated to a mounting substrate.

However, in this package, it is not impossible to check the state of the solder junction from outside after mounting since the copper-foil wiring on the substrate is formed to cover the through-hole.

Accordingly, in the BGA or LGA type semiconductor device, mass producibility, excellent mounting performance, easiness of outside checking after mounting, low package cost and the like are required. Among these requirements, the easiness of outside checking is a most important requirement since it relates to an electrical test, repairing etc. after mounting.

Hereon, the first and third prior arts have a problem that the state of the solder junction can not be observed after mounting. In addition, in the first prior art, the package cost becomes higher since the package employs a film carrier tape of two layers-two metals structure, and the package lacks in mass producibility since it needs the reinforcing plate 13.

In the second prior art, as shown in FIG. 2B, it is possible to check the state of the solder junction from outside after mounting. However, this package lacks in mass producibility in that it uses a rigid substrate as a substrate, as compared with a package using a film carrier tape. Further, in this package structure, the through-hole plating 17c, the solder plating 19 on the land 17b and the copper plate 18 for maintaining the level even to the soldered portion after mounting are required. Thus, the package structure is complex, and the package cost becomes higher.

In addition, in the second and third prior arts, solder required in mounting is provided not with the package but with the mounting substrate. The solder of solder paste or the like is supplied to a screen printing method. For example, when the pitch P3 between the lands 17b is 1.27 mm, the diameter of the land is to be about 0.5 to 0.6 mm. Herein, the gap between the package and the mounting substrate after mounting needs to be about 0.5 to 1.0 mm in order to securely connect therebetween and reduce a thermal stress occurred therebetween by the difference in their thermal expansion coefficients. Therefore, it is necessary to supply solder paste to have a thickness of 1.0 to 1.5 mm to the land with a diameter of about 0.5 to 0.6 mm. As a result, the package in the second and third prior arts lack in easiness of mounting.

SUMMARY OF THE INVENTION

Accordingly, it is an object of the invention to provide a semiconductor device in which the state of the junction of a bump to a land and the state of the junction of a bump to a mounting substrate can be easily checked.

It is another object of the invention to provide a semiconductor device in which electrical characteristics can be easily checked after mounting.

It is a further object of the invention to provide a semiconductor device which satisfies mass producibility and low manufacturing cost.

It is a still further object of the invention to provide a semiconductor device which has an excellent workability in mounting.

According to the invention, a semiconductor device, comprises:

a film carrier tape comprising a base film in which a device hole and a through-hole are formed and a metal-foil wiring layer formed on the base film, wherein the metal-foil wiring layer includes one end extending into the device hole to form a inner lead and the other end extending onto the through-hole to form a land;

a semiconductor integrated circuit chip which is provided with an electrode which is connected with the inner lead of the metal-foil wiring layer;

sealing resin for protecting the semiconductor integrated circuit chip; and a bump which is formed on the land and is formed on a front or back surface of the base film, the bump being made of a conductive material;

wherein an aperture with dimensions smaller than the through-hole is formed in the center of the land of the metal-foil wiring layer.

BRIEF DESCRIPTION OF THE DRAWINGS

The invention will be explained in more detail in conjunction with the appended drawings, wherein.

DESCRIPTION OF THE PREFERRED EMBODIMENTS

Figure 1A:
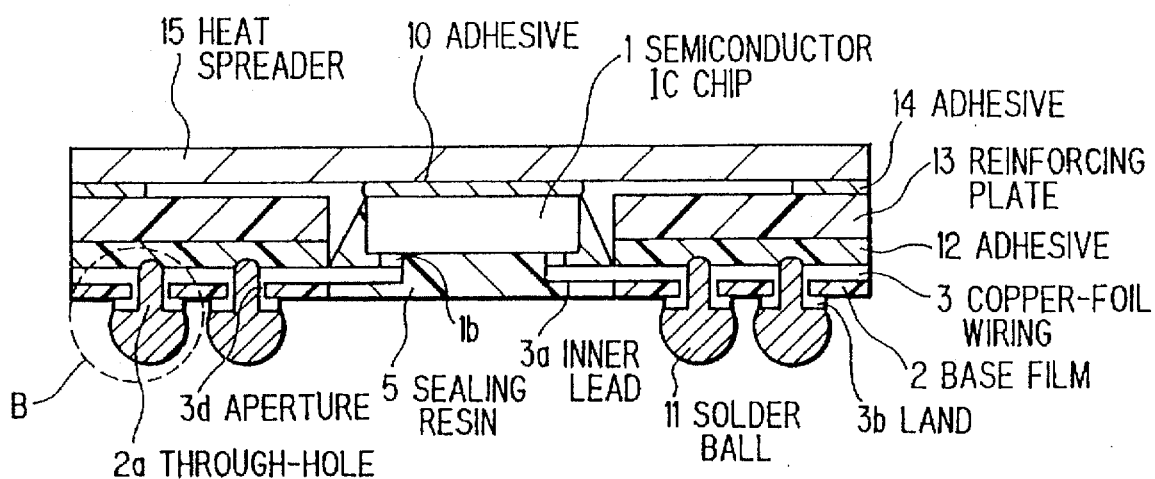
FIG. 1A is a cross sectional view showing a conventional semiconductor device.
Figure 1B:
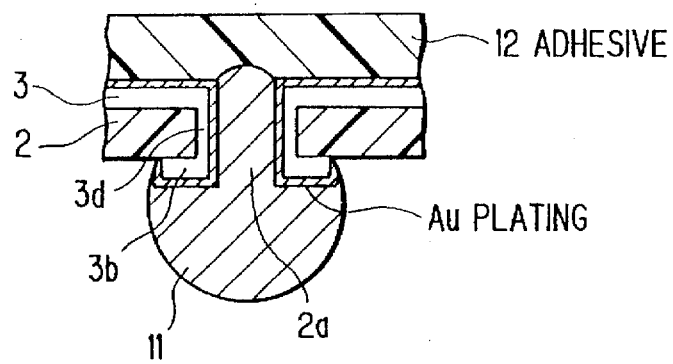
FIG. 1B is an enlarged cross sectional view showing a part of the semiconductor device in FIG. 1A.
Figure 2A:
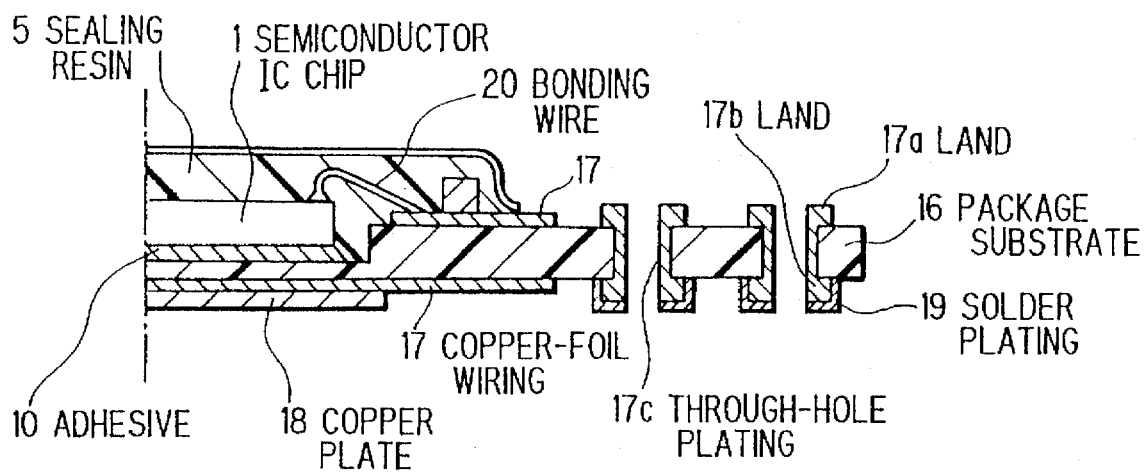
FIG. 2A is a cross sectional view showing another conventional semiconductor device.
Figure 2B:
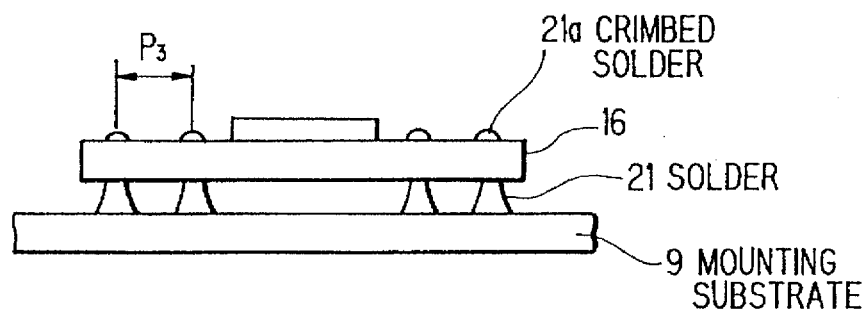
FIG. 2B is a front view showing the mounting state of the semiconductor device in FIG. 2A.
Figure 3A:
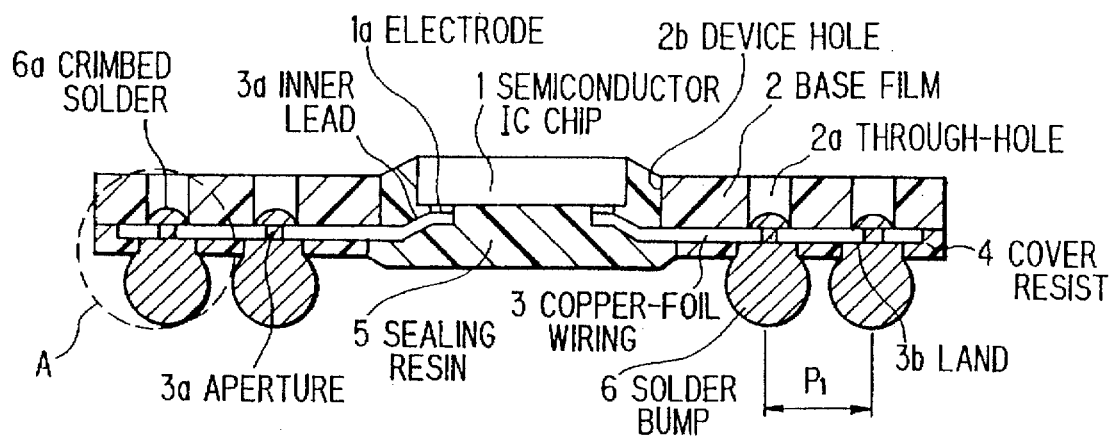
FIG. 3A is a cross sectional view showing a semiconductor device in a first preferred embodiment according to the invention.

A semiconductor device in a first preferred embodiment according to the invention will be explained in FIGS. 3A and 3B, wherein like parts are indicated by like reference numerals as used in FIGS. 1A and 1B. FIG. 3A is a cross sectional view showing the semiconductor device in the first preferred embodiment, and FIG. 3B is an enlarged cross sectional view showing a part of the semiconductor device in FIG. 3A which is indicated by a circle A.

Figure 3B:
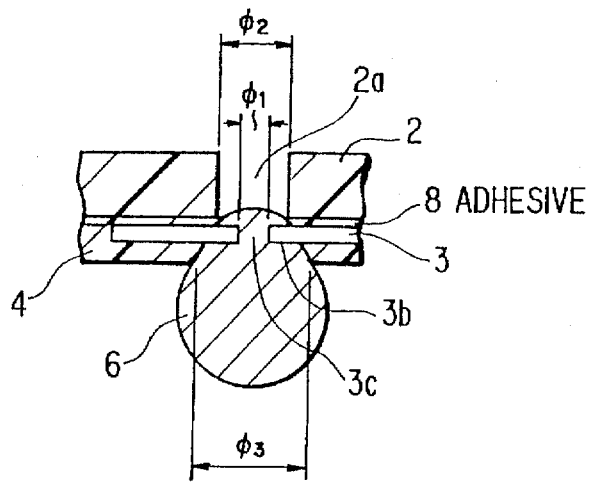
FIG. 3B is an enlarged cross sectional view showing a part of the semiconductor device in FIG. 3A, FIGS. 4A to 4D are cross sectional views showing a method for making the semiconductor device in the first preferred embodiment.

As shown in FIGS. 3A and 3B, the semiconductor device in the first embodiment comprises a semiconductor IC chip 1, a base film 2 forming a basis of a film carrier tape, through-holes 2a and device holes 2b which open in the base film 2, a copper-foil wiring 3 formed on the base film 2, inner leads 3a formed at the inside end of the copper-foil wiring 3, lands 3b for connecting to outside, apertures 3c formed in the center of the respective lands 3b, cover resist 4 formed on the base film 2 except the lands 3b, sealing resin 5 for protecting the semiconductor IC chip 1 and solder bumps 6.

Herein, when the dimensions of the opening portions of the through-hole 2a, the aperture 3c in the copper-foil wiring 3 and the cover resist 4 are, as shown in FIG. 3B, $\Phi 2$, $\Phi 1$ and $\Phi 3$, respectively, they are formed to keep the relationship of $\Phi 3 \geq \Phi 2 > \Phi 1$.

The film carrier tape is made by a method for making a conventional three layers-one metal composition tape. The through-holes 2a are opened together with the device holes 2b by a punching or laser method. The copper-foil wiring 3 which includes the inner leads 3a and land 3b and in which the apertures 3c is formed is formed by resist-coating, exposing, developing and etching to a copper tape. The cover resist 4 has a predetermined pattern formed by a screen-printing method or the like. The solder bumps 6 are formed by, for example, disposing solder balls on the lands 3b and re-flowing them.

Herein, for example, to provide the solder bumps 6 with a pitch P1 therebetween of 1.27 mm, the dimensions ($\Phi 2$) of the through-holes 2a is 0.35 to 0.4 mm, the dimensions ($\Phi 1$) of the apertures 3c in the copper-foil wiring 3 is 0.2 to 0.25 mm and the dimensions ($\Phi 3$) openings of the cover resist 4 is 0.4 to 0.6 mm. In this case, the height of the solder bump 6 becomes about 0.5 to 0.8 mm when a solder ball with a diameter of 0.7 to 0.9 mm is provided and re-flown.

In the re-flowing process, solder climbs up to the though-hole 2a through the aperture 3c since the aperture 3c formed in the land 3b gives an escape for the flux and decomposed gas of the solder ball. The climbed solder 6a does not reach the surface of the base film 2 since the side of the through-hole 2a is not plated and the base film 2 is made of polyimide or polyester resin which does not have a good wetness property to the solder. It stops at a constant level from behind the land 3b thereby uniforming the profile and height of the solder bump 6.

Hereon, the adhesion strength of the solder bump 6 to the land 3b can be enhanced since solder is connecting between the front and back surfaces of land 3b through the aperture 3c. Furthermore, since the climbed solder 6a connected to the surface of the base film 2 can be observed from the backside of the base film 2, the junction state of the solder bump 6 can be easily checked.

FIGS. 4A to 4D are cross sectional views showing a method for making the semiconductor device in the first embodiment. At first, as shown in FIG. 4A, the electrode 1a of the semiconductor IC chip 1 is bonded to the inner lead 3a extending from the film carrier tape as explained in FIGS. 3A and 3B. Herein, the copper-foil wiring 3 is formed by a copper foil with a thickness of about 35 μm. Optionally, the surface of the inner lead 3a or land 3b may be provided with gold plating with a thickness of 0.2 to 1.0 μm, or tin plating with a thickness of 0.3 to 0.5 μm.

The semiconductor IC chip 1 has a bump with a thickness of about 10 to 30 μm as an electrode 1a. However, an aluminum electrode with a thickness of about 1 to 2 μm which is in general provided with the semiconductor IC chip may be used as it is. In the method for bonding the inner lead, a package bonding manner (gang bonding manner) or a single point manner can be employed when the bump is formed as the electrode 1a. If the electrode 1a is an aluminum electrode, the single point manner can be employed.

Next, as shown in FIG. 4B, the sealing resin 5 is formed by supplying resin to the electrode side of the semiconductor IC chip by a potting method and curing it. This is not only for protecting the semiconductor IC chip, but also for protecting the inner lead 3a and securely fixing it to the base film 2. For supplying the resin, the potting method may be replaced by a screen printing method or the like. The thickness of the sealing resin 5 is desirably about 200 to 300 μm from the surface of the semiconductor IC chip 1.

Thereafter, as shown in FIG. 4C, the solder bump 6 is formed by coating with flux, supplying a solder ball thereto and re-flowing it. As the method for forming the solder bump 6, a screen printing method, a dispenser method, an injection method of supplying fused solder, a ball bonding method of using a solder wire or the like can be used. The solder bump may be replaced by another metal bump. For example, a metal ball covered with solder can be used to form the bump.

The film carrier BGA type semiconductor device made by such process, as shown in FIG. 4D, is mounted on the mounting substrate 9 by means of pads 9a and the solder bumps 6 in a package re-flowing manner.

In the semiconductor device, since the solder bumps 6 is formed by using solder balls, mounting to the mounting substrate 9 can be performed only by providing solder paste with a thickness of 0.1 to 0.2 mm as the pads 9a and can be performed together with another surface mounting type package, for example, QFP (quad flat package), in the same re-flowing manner.

As explained above, in the film carrier BGA type semiconductor device in the first embodiment, since the aperture 3c is formed in the center of the land 3b and the through-hole 2a is formed in the base film 2, the junction state of the solder to the land can be easily checked from outside at the stage of supplying the solder balls to the package to form the solder bump 6. Furthermore, also in mounting the BGA package on the mounting substrate 9, the junction state of the solder can be checked by looking at the climbed solder 6a from the through-holes 2a in the base film 2.

Thus, the BGA package can be made at a low cost since it uses the film carrier of a cheaper three layers-one metal composition.

Figure 5A:
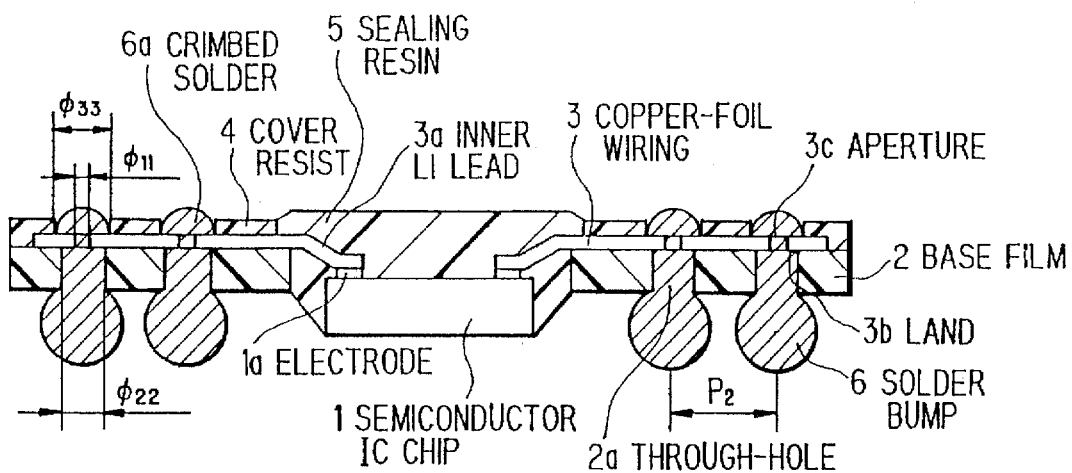
FIG. 5A is a cross sectional view showing a semiconductor device in a second preferred embodiment according to the invention.
Figure 5B:
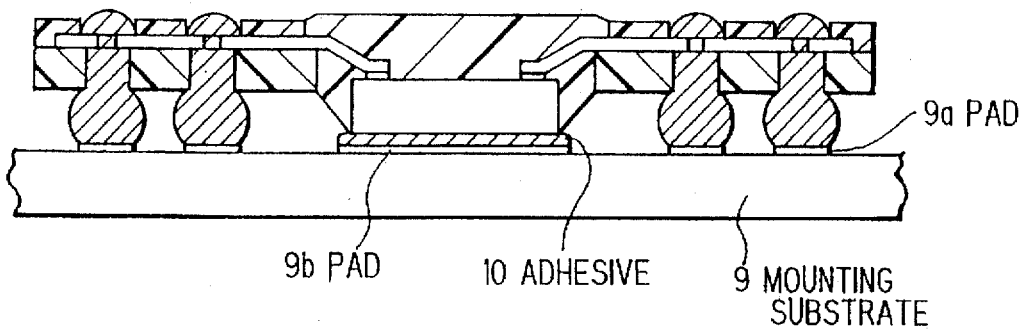
FIG. 5B is a cross sectional view showing the mounting state of the semiconductor device in FIG. 5A.

With reference to FIGS. 5A and 5B, a semiconductor device in a second preferred embodiment will be explained. Herein, FIG. 5A is a cross sectional view showing the semiconductor device in the second preferred embodiment, and FIG. 5B is a cross sectional view showing the state of mounting the semiconductor device in FIG. 5A.

As shown in FIG. 5A, the semiconductor device in the second embodiment comprises a semiconductor IC chip 1, a base film 2, through-holes 2a which open in the base film 2, a copper-foil wiring 3, inner leads 3a, land 3b, apertures 3c formed in the center of the respective lands 3b, cover resist 4, sealing resin 5, solder bumps 6 and climbed solder 6a. The difference from the first embodiment is that the solder bumps 6 are formed from the copper-foil wiring 3 toward the base film 2.

Herein, when the dimensions of the opening portions of the through-hole 2a, the aperture 3c in the copper-foil wiring 3 and the cover resist 4 are, as shown in FIG. 5A, Φ22, Φ11 and Φ33, respectively, they are formed to keep the relationship of Φ33≧Φ22>Φ11. The film carrier tape is also made by a method for making a conventional three layers-one metal composition tape.

Herein, for example, to provide the solder bumps 6 with a pitch P2 therebetween of 1.0 mm, Φ11 is 0.1 to 0.2 mm, Φ22 is 0.3 to 0.35 mm and Φ33 is 0.35 to 0.5 mm, thereafter coating the through-hole 2a with flux, supplying a solder ball with a diameter of 0.6 to 0.7 mm and re-flowing it. In this case, the height of the solder bump 6 becomes about 0.4 to 0.6 mm.

In this re-flowing process, the solder balls do not short each other since the bump pitch P2 is 1.0 mm and the diameter of the solder ball is 0.6 to 0.7 mm to which Φ22 is 0.3 to 0.35 mm and the base film 2 is made of polyimide resin or the like which does not have a good wetness property to the solder. On the other hand, solder climbs up to the cover resist 4 through the aperture 3c with Φ11 of 0.15 and 0.2 mm formed in the center of the land 3b to form the climbed solder 6a, where the aperture 3c gives an escape for the flux and decomposed gas of the solder ball.

Since the backside of the land 3b is coated with the cover resist 4 which does not have a good wetness property, the climbed bumps 6a do not short each other and the solder bumps 6 after re-flowing have an uniform profile and height of 0.4 to 0.6 mm.

In this embodiment, since the climbed solder 6a can be observed from the front of the base film 2, the junction state of the solder bump 6 which is formed on the back of the base film to land 3b can be easily checked.

The semiconductor device made by such process, as shown in FIG. 5B, is mounted on the mounting substrate 9 by means of pads 9a and the solder bumps 6 in a package re-flowing manner. Herein, the back surface of the semiconductor IC chip 1 may also be adhered to the mounting substrate 9 by a pad 9b. Thereby, according to this embodiment, even if the semiconductor IC chip generates much heat, heat can be discharged from the chip to the mounting substrate 9.

Figure 6:
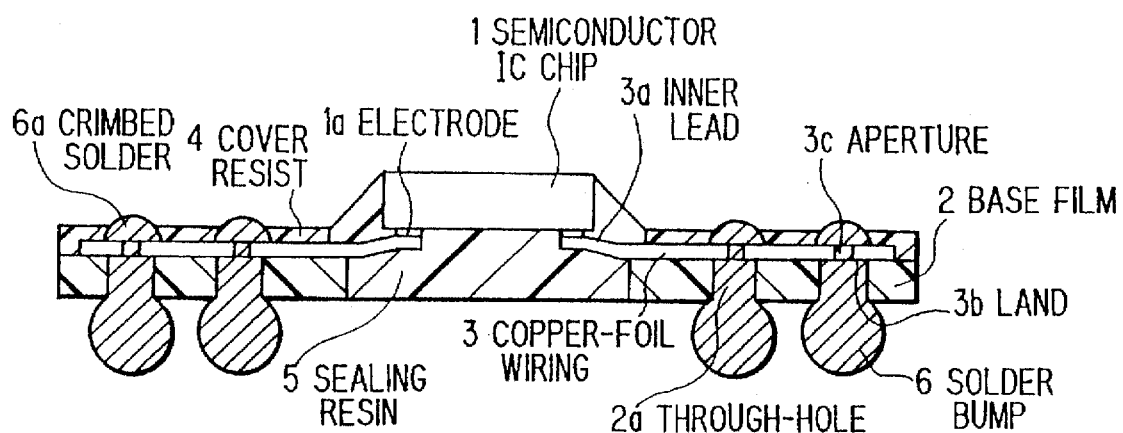
FIG. 6 is a cross sectional view showing a semiconductor device in a third preferred embodiment according to the invention.

Next, a semiconductor device in a third preferred embodiment will be explained in FIG. 6, wherein like parts are indicated by like reference numerals as used in FIGS. 5A and 5B. Also in the third embodiment, the solder bumps 6 are formed from the copper-foil wiring 3 toward the base film 2. However, the semiconductor IC chip 1 is placed facing to the front surface of the base film 2, i.e., in a face-up manner.

Figure 7:
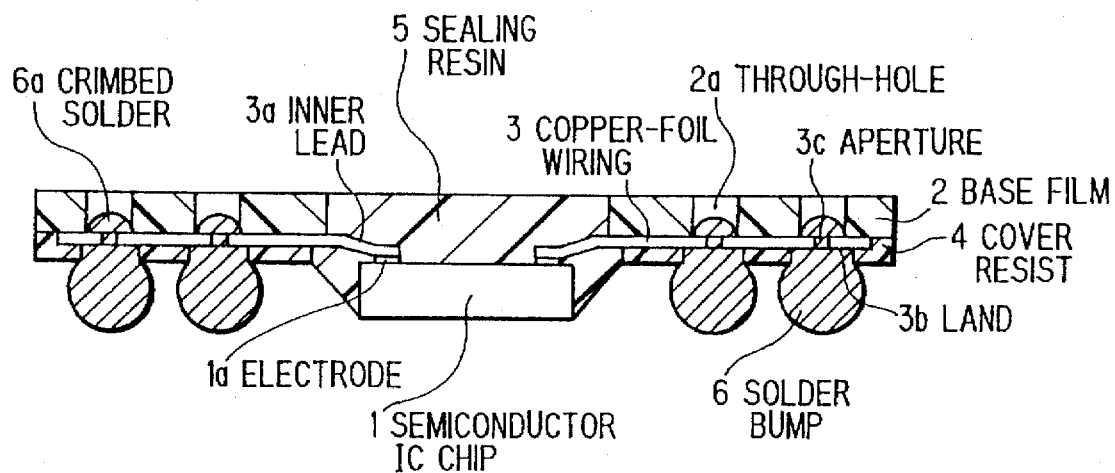
FIG. 7 is a cross sectional view showing a semiconductor device in a fourth preferred embodiment according to the invention.

Further, a semiconductor device in a fourth preferred embodiment will be explained in FIG. 7, wherein like parts are indicated by like reference numerals as used in FIGS. 3A and 3B. In the fourth embodiment, the semiconductor IC chip 1 is placed facing to the back surface of the base film 2, i.e., in a face-down manner.

Thus, in the film carrier BGA type semiconductor device according to the invention, a semiconductor IC chip may be bonded in both a face-up manner and a face-down manner. Also, bumps may be formed on both a base film and a cover resist. Therefore, the structure of the semiconductor device can be optionally selected depending on the characteristics and mounting structure of an IC chip.

The semiconductor device according to the invention has a structure that the junction state of a solder bump to a copper-foil wiring and the junction state of a package to a mounting substrate can be easily checked. Further, the electrical characteristics of the semiconductor device can be easily observed even after mounting. Thereby, it has an advantage that one can instantly judge the semiconductor device to be repaired or to be again re-flown.

Though the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A semiconductor device, comprising:

a film carrier tape comprising a base film in which a device hole and through-hole are formed and a metal-foil wiring layer formed on said base film, wherein said metal-foil writing layer includes one coplanar end extending into said device hole to form an inner lead and the other coplanar end extending onto said through-hole to form a land;

a semiconductor integrated circuit chip which is provided with an electrode which is connected with said inner lead of said metal-foil wiring layer;

sealing resin for protecting said semiconductor integrated circuit chip; and a bump which is formed on said land and is formed on a front or back surface of said base film, said bump being made of a conductor material;

wherein an aperture with dimensions smaller than said through-hole is formed in the center of said land of said metal-foil wiring layer, whereby the material of the bump contacts both the front and back surfaces of the land.

2. A semiconductor device, according to claim 1, further comprising:

cover resist which is formed on said metal-foil wiring layer and has an opening corresponding to said land.

3. A semiconductor device, according to claim 2, wherein:

said opening of said cover resist has dimensions bigger than said through-hole.

4. A semiconductor device, according to claim 1, wherein:

said bump is made of a solder ball.

5. A semiconductor device, according to claim 1, wherein:

said bump has a portion which climbs up through said aperture onto a surface reverse to the surface where said bump is formed.

6. A semiconductor device, according to claim 1, wherein:

said inner lead and/or said land of said metal-foil layer is plated by gold or tin.

7. A semiconductor device, according to claim 1, wherein:

said electrode of said semiconductor integrated circuit forms a bump.

8. A semiconductor device, comprising:

a film carrier tape comprising a base film in which a device hole and a through-hole are formed and a metal-foil wiring layer formed on said base film, wherein said metal-foil wiring layer includes one end extending into said device hole to form an inner lead and the other end extending onto said through-hole to form a land having front and back surfaces;

a semiconductor integrated circuit chip which is provided with an electrode which is connected with said inner lead of said metal-foil wiring layer;

a bump which is formed on said land and is formed on a front or back surface of said base film, said bump being made of a conductive material;

the land in the region of the through-hole having a dimension smaller than said through-hole whereby the material of the bump contacts both the front and back surfaces of the land.

* * * * *